United States Patent [19]

McDunn et al.

[11] Patent Number: 5,718,117
[45] Date of Patent: Feb. 17, 1998

[54] APPARATUS AND METHOD FOR SPRAY-COOLING AN ELECTRONIC MODULE

[75] Inventors: Kevin J. McDunn, Lake in the Hills; Linda Limper-Brenner, Glenview; Minoo D. Press, Schaumburg, all of Ill.

[73] Assignee: Motorola, Inc., Schaumburg, Ill.

[21] Appl. No.: 630,135

[22] Filed: Apr. 10, 1996

[51] Int. Cl.$^6$ ....................................................... F25D 17/02
[52] U.S. Cl. ..................... 62/64; 62/259.2; 165/908; 165/104.33; 239/548; 361/699
[58] Field of Search ................... 62/64, 259.2; 165/170, 165/174, 908, 104.33, 104.25; 361/698, 699, 719–721; 239/548, 557

[56] References Cited

U.S. PATENT DOCUMENTS

| | | |
|---|---|---|
| 3,035,419 | 5/1962 | Wigert ............................ 62/259.2 |
| 3,725,566 | 4/1973 | Plizak . |
| 4,399,484 | 8/1983 | Mayer . |
| 4,434,112 | 2/1984 | Pollock ............................. 165/170 X |
| 4,542,076 | 9/1985 | Bednarz et al. . |
| 4,706,164 | 11/1987 | L'Hennaff et al. . |
| 4,711,431 | 12/1987 | Viannay et al. . |
| 4,847,731 | 7/1989 | Smolley . |
| 4,854,377 | 8/1989 | Komoto et al. . |
| 4,884,167 | 11/1989 | Mine . |
| 4,912,600 | 3/1990 | Jaeger et al. ..................... 165/104.33 X |
| 4,935,864 | 6/1990 | Schmidt et al. . |
| 4,945,980 | 8/1990 | Umezawa . |
| 4,964,019 | 10/1990 | Belanger, Jr. . |
| 5,014,777 | 5/1991 | Sano . |
| 5,050,037 | 9/1991 | Yamamoto et al. . |
| 5,057,968 | 10/1991 | Morrison . |
| 5,131,233 | 7/1992 | Cray et al. . |
| 5,166,863 | 11/1992 | Shmunis . |
| 5,174,364 | 12/1992 | Mizuno . |
| 5,175,395 | 12/1992 | Moore . |
| 5,177,666 | 1/1993 | Bland et al. . |
| 5,190,099 | 3/1993 | Mon . |
| 5,210,440 | 5/1993 | Long . |
| 5,220,804 | 6/1993 | Tilton et al. . |
| 5,232,164 | 8/1993 | Resch et al. . |
| 5,256,833 | 10/1993 | Schwenk . |
| 5,264,984 | 11/1993 | Akamatsu . |
| 5,270,572 | 12/1993 | Nakajima et al. .................. 361/699 X |
| 5,285,351 | 2/1994 | Ikeda . |
| 5,289,363 | 2/1994 | Ferchau et al. . |
| 5,329,419 | 7/1994 | Umezawa . |
| 5,348,076 | 9/1994 | Asakawa . |
| 5,360,993 | 11/1994 | Mine . |
| 5,384,687 | 1/1995 | Sano . |
| 5,388,030 | 2/1995 | Gasser et al. . |
| 5,431,974 | 7/1995 | Pierce . |
| 5,436,501 | 7/1995 | Ikeda . |
| 5,436,793 | 7/1995 | Sanwo et al. . |
| 5,463,528 | 10/1995 | Umezawa . |
| 5,483,423 | 1/1996 | Lewis et al. . |
| 5,491,363 | 2/1996 | Yoshikawa . |
| 5,675,473 | 10/1997 | McDunn et al. ...................... 361/699 |

OTHER PUBLICATIONS

Kurt A. Estes and Issam Mudawar, "Comparison of Two-Phase Electronic Cooling Using Free Jets and Sprays", Journal of Electronic Packaging, vol. 117, pp. 323–331, Dec. 1995.

M. Ghodbane et al., "Experimental Study of Spray Cooling with Freon–113", Int. J. Heat Mass Transfer, vol. 34, No. 4/5, pp. 1163–1174 (1991).

(List continued on next page.)

*Primary Examiner*—Henry A. Bennett
*Assistant Examiner*—Susanne C. Tinker
*Attorney, Agent, or Firm*—Heather L. Creps

[57] ABSTRACT

The apparatus includes a plate (10) having a first layer (12) and a second layer (14) opposed to the first layer (12). A first fluid distributing conduit (28) is disposed in the first layer (12) and a second fluid distributing conduit (28) is disposed in the second layer (14). A first nozzle housing (30) having a first aperture (36) is disposed in the first fluid distributing conduit (28) and a second nozzle housing (30) having a second aperture (36) is disposed in the second fluid distributing conduit (28).

18 Claims, 3 Drawing Sheets

OTHER PUBLICATIONS

J.P. Holman et al., "Extended Studies of Spray Cooling with Freon–113", Int. J. Heat Mass Transfer, vol. 36, No. 8, pp. 2239–2241 (1992).

Donald E. Tilton et al., "High–Flux Spray Cooling in a Simulated Multichip Module", HTD—vol. 206–2, Topics in Heat Transfer—vol. 2, ASME (1992).

S.K. Chen et al., "Factors Influencing the Effective Spray Cone Angle of Pressure–Swirl Atomizers," Journal of Engineering for Gas Turbines and Power, vol. 114, pp. 97–103 (Jan. 1992).

Donald Tilton et al., "Advanced Thermal Management for Multichip Modules", Electronic Packaging and Production, pp. 71–73 (Aug. 1995).

Kurt A. Estes et al., "Correlation of Sauter Mean Diameter and Critical Heat Flux for Spray Cooling of Small Surfaces", Int. J. Heat Mass Transfer, vol. 38, No. 16, pp. 2985–2996 (1995).

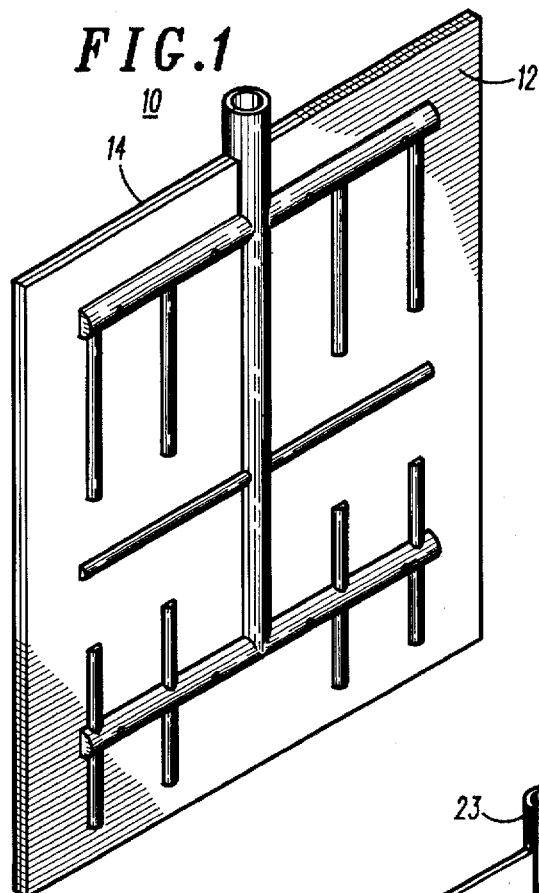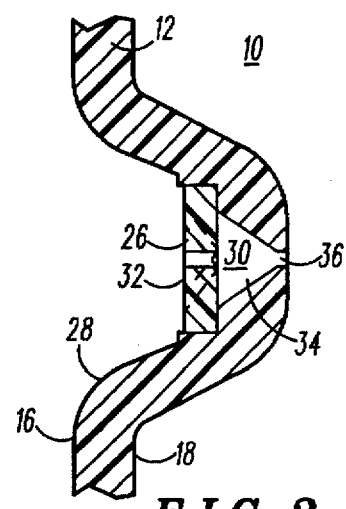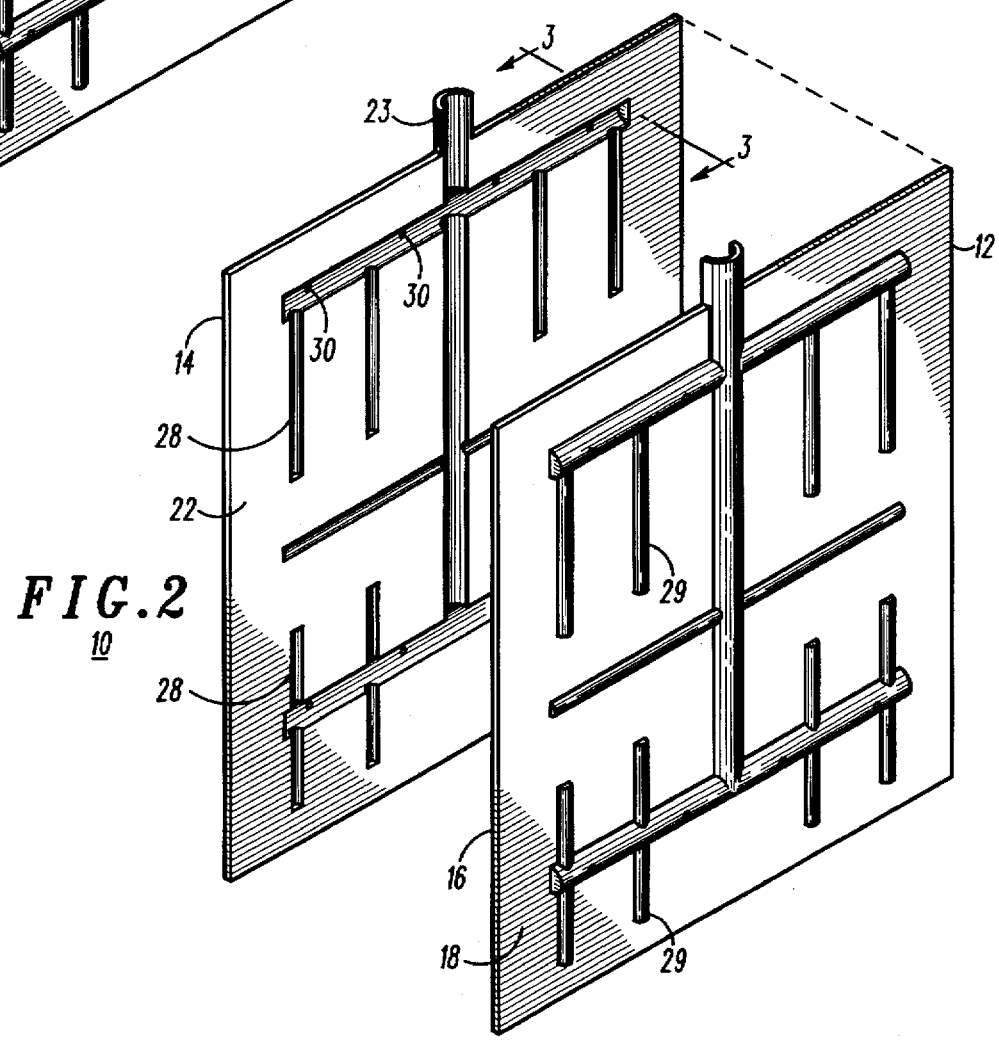

10

5,718,117

APPARATUS AND METHOD FOR SPRAY-COOLING AN ELECTRONIC MODULE

This application is related to copending application Ser. No. TBA, docket number CE03015R, filed Apr. 10, 1996, commonly assigned with the present invention.

FIELD OF THE INVENTION

This invention relates generally to the cooling of electronic modules, and, more particularly, to an apparatus and method for spray-cooling an electronic module.

BACKGROUND OF THE INVENTION

Electronic modules such as multi-chip modules, electronic hybrid assemblies such as power amplifiers, and passive components such as filters may contain heat sources which require cooling during normal operation. Often, electronic modules are disposed on substrates such as printed circuit boards, and operate in rack-type housings such as Versa Module Europe (VME) cages or Electronic Industries Association (EIA) sub-racks.

Generally, electronic modules and their associated components are cooled by natural or forced air convection which, because of the relatively poor thermal capacitance and heat transfer coefficients of air, requires moving large volumes of air past the electronic modules, or past heavy heat sinks attached to the modules. In a rack-type housing, air-cooling may result in wide spacing between the electronic modules, which could cause the housing to be overly large. In addition, the air cooling process may introduce undesired acoustic noise or other contaminants, such as dust, into the electronic modules.

Evaporative spray cooling features the spraying of atomized fluid droplets directly onto a surface of a heat source such as an electronic module. When the fluid droplets impinge upon the module's surface, a thin film of fluid coats the module, and heat is removed primarily by evaporation of the fluid from the module's surface.

Although evaporative spray cooling is a preferred method of heat removal in many electronics applications, housings for electronic modules must frequently be re-designed for the purpose of spray-cooling the electronic modules.

There is therefore a need for an apparatus and method for spray-cooling an electronic module which may be integrated into a traditional rack-type housing.

SUMMARY OF THE INVENTION

According to an aspect of the present invention, the foregoing need is addressed by an apparatus for spray-cooling an electronic module which includes a plate having a first layer and a second layer opposed to the first layer. A first fluid distributing conduit is disposed in the first layer and a second fluid distributing conduit is disposed in the second layer. A first nozzle housing having a first aperture is disposed in the first fluid distributing conduit and a second nozzle housing having a second aperture is disposed in the second fluid distributing conduit.

According to another aspect of the present invention, an apparatus for spray-cooling an electronic module includes a plate having a first layer and a second layer, the first layer having a first interior surface and a first exterior surface and the second layer having a second interior surface and a second exterior surface. A first fluid distributing conduit is formed in the first interior surface and a second fluid distributing conduit is formed in the second interior surface and is substantially aligned with the first fluid distributing conduit to form a manifold. A first nozzle is disposed in the first fluid distributing conduit. The first nozzle has a first receptacle end and a first spray end. The first spray end has a first aperture. The first receptacle end is in communication with the first fluid distributing conduit and the first spray end is in communication with the first exterior surface. A second nozzle is disposed in the second fluid distributing conduit. The second nozzle has a second receptacle end and a second spray end. The second spray end has a second aperture. The second receptacle end is in communication with the second fluid distributing conduit and the second spray end is in communication with the second exterior surface. The first receptacle end receives a fluid from the first fluid distributing conduit, the first spray end atomizes the fluid and discharges the atomized fluid through the first aperture. The second receptacle end receives the fluid from the second fluid distributing conduit, the second spray end atomizes the fluid and discharges the atomized fluid through the second aperture.

According to a further aspect of the present invention, a method for spray-cooling an electronic module includes providing a plate having a first layer and a second layer, the first layer having a first fluid distributing conduit and the second layer having a second fluid distributing conduit;

receiving a fluid by a first nozzle disposed in the first fluid distributing conduit, the first nozzle having a first aperture; receiving the fluid by a second nozzle disposed in the second fluid distributing conduit, the second nozzle having a second aperture; discharging the fluid via the first aperture; and discharging the fluid via the second aperture.

Advantages of the present invention will become readily apparent to those skilled in the art from the following description of the preferred embodiments of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 1 is a partial perspective view of an apparatus for spray-cooling an electronic module according to a preferred embodiment of the present invention.

FIG. 2 is an expanded perspective view of the apparatus depicted in FIG. 1.

FIG. 3 is a cross-sectional view of the apparatus depicted in FIG. 2 along line 3—3, illustrating a nozzle housing according to the preferred embodiment of the present invention.

DETAILED DESCRIPTION OF THE PREFERRED EMBODIMENTS

Figure 4:
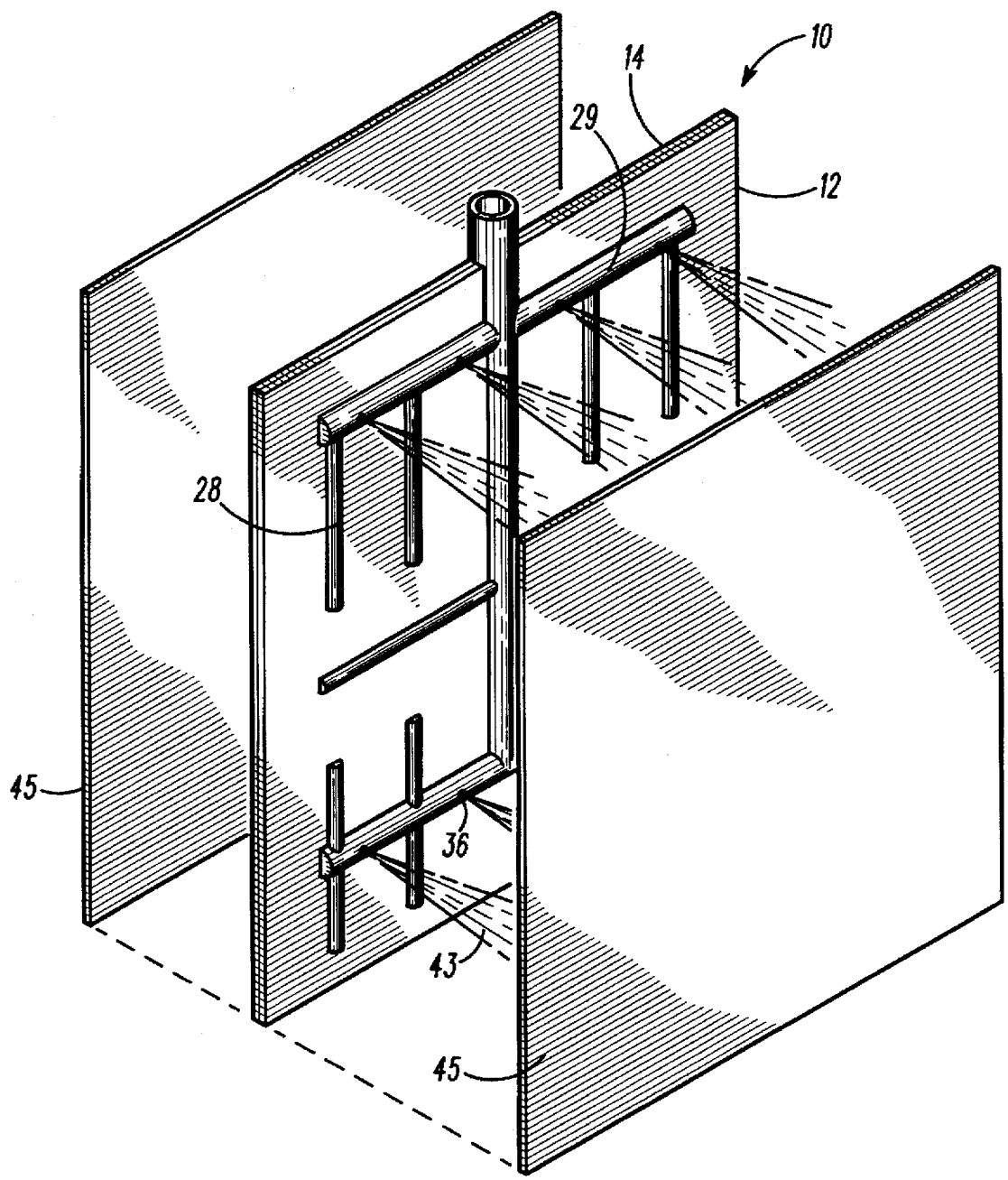
FIG. 4 is a perspective view of the apparatus illustrated in FIGS. 1 and 2, depicting a manner of operation for simultaneously cooling electronic modules on two printed circuit boards.

Turning now to the drawings, wherein like numerals designate like components, FIG. 1 is a partial perspective view of an apparatus for spray-cooling an electronic module according to a preferred embodiment of the present invention. As shown, the apparatus includes a plate 10 that is substantially rectangular. Plate 10, however, may be any desired shape, and may be constructed of any suitable material, for example plastic or a metal such as aluminum.

Plate 10 has a first layer 12 and a second layer 14. As shown in FIG. 2, first layer 12 and second layer 14 may be separate pieces, which may be fastened together using a variety of methods and materials. For example, fasteners such as screws, compliant gaskets, bonding, ultrasonic welding, soldering or brazing may be utilized. Alternatively, plate 10 may be formed as a single part, using gas-assist injection molding, for example, forming internal voids (discussed further below) during the molding process.

When first layer 12 is separated from second layer 14, as depicted in FIG. 2, it can be seen that first layer 12 has an interior surface 16 and an exterior surface 18. Likewise, second layer 14 has an interior surface 20 and an exterior surface 22.

At least one fluid distributing conduit 28 is disposed in interior surface 16 of first layer 12 and in interior surface 20 of second layer 14. A number of fluid distributing conduits 28, which result in protrusions 29 on exterior surfaces 18, 22 of first and second layers 12, 14, respectively, are shown in FIG. 2. Fluid distributing conduits 28 in interior surface 16 of first layer 12 may be grooves which as shown are substantially aligned with fluid distributing conduits 28 in interior surface 20 of second layer 14, which may also be grooves, so that manifolds are formed within plate 10. A particular fluid distributing conduit 28 in interior surface 16, however, need not be aligned with a corresponding fluid distributing conduit 28 in interior surface 20. Fluid distributing conduits 28 may have any cross-sectional shape. Conical, rectangular or circular cross-sectional shapes are preferred.

A fluid inlet port 23 may be formed integrally with layers 12, 14, as shown in FIG. 2. Alternatively, fluid inlet port 23 may be separately coupled to plate 10, using a barbed fitting, for example.

At least one nozzle housing 30 is disposed in at least one fluid distributing conduit 28. FIG. 3 is a cross-sectional view of FIG. 2 along line 3—3, illustrating one nozzle housing 30 in first layer 12. Nozzle housing 30 has a receptacle end 32 which is in communication with fluid distributing conduit 28. A spray end 34 of nozzle housing 30 is at least in part in communication with exterior surface 18 of first layer 12, and includes an aperture 36. Aperture 36 is preferably on the order of 0.15 mm in diameter.

Each nozzle housing 30 is sized to receive a nozzle 26, which may be, as shown in FIG. 3, a swirl plate or insert. Nozzle 26 may be secured to nozzle housing 30 by, for example, press-fitting, soldering or bonding. Alternatively, nozzle 26 may be integrally formed in fluid distributing conduit 28.

Nozzles 26 are preferably miniature atomizers such as simplex pressure-swirl atomizers, which are approximately 0.3 mm high, and may be made of any suitable material. An example of a suitable material is a metallic material such as brass or stainless steel. Simplex pressure-swirl atomizers are described in detail in U.S. Pat. No. 5,220,804 to Tilton et al., incorporated herein by reference, and are commercially available from Isothermal Systems Research, Inc., located in Colton, Wash.

FIG. 4 depicts a manner of operation of plate 10, for simultaneously cooling electronic modules on two printed circuit boards 45. Referring to FIGS. 1 through 4 collectively, fluid distributing conduits 28 in first layer 12 and second layer 14 of plate 10 receive a coolant fluid via fluid inlet port 23, and supply the fluid to receptacle ends 32 of a number of nozzles 26 disposed in fluid distributing conduits 28. Visible in FIG. 4 are protrusions 29 onto exterior surface 18 of first layer 12 caused by fluid distributing conduits 28 (not visible) formed in interior surface 16 of first layer Spray ends 34 of nozzles 26 atomize the fluid and discharge the atomized fluid 43 through apertures preferably at a perpendicular angle to exterior surfaces 18 and 22. Alternatively, atomized fluid 43 may be discharged at a slight angle to exterior surfaces 18 and 22. Atomized fluid 43 is sprayed substantially simultaneously onto two printed circuit boards 45, which may include electronic modules such as multi-chip modules, electronic hybrid assemblies or passive components, among other things.

The coolant fluid is preferably a dielectric fluid such as 3M's Fluorinert™ dielectric fluid, order number FC-72, but may be another suitable dielectric fluid, such fluids being well-known and widely available. For example, a perfluorocarbon fluid similar to 3M's Fluorinert™ dielectric fluid is available from Ausimont Galden®.

An electronic module having a power density of up to three-hundred Watts per square centimeter is effectively cooled by one side 12, 14 of plate 10. The removal of heat directly from electronic modules helps to reduce operating temperatures of the modules and their associated components, increasing reliability through significant reduction of thermal variation and associated thermal stresses.

Figure 5:
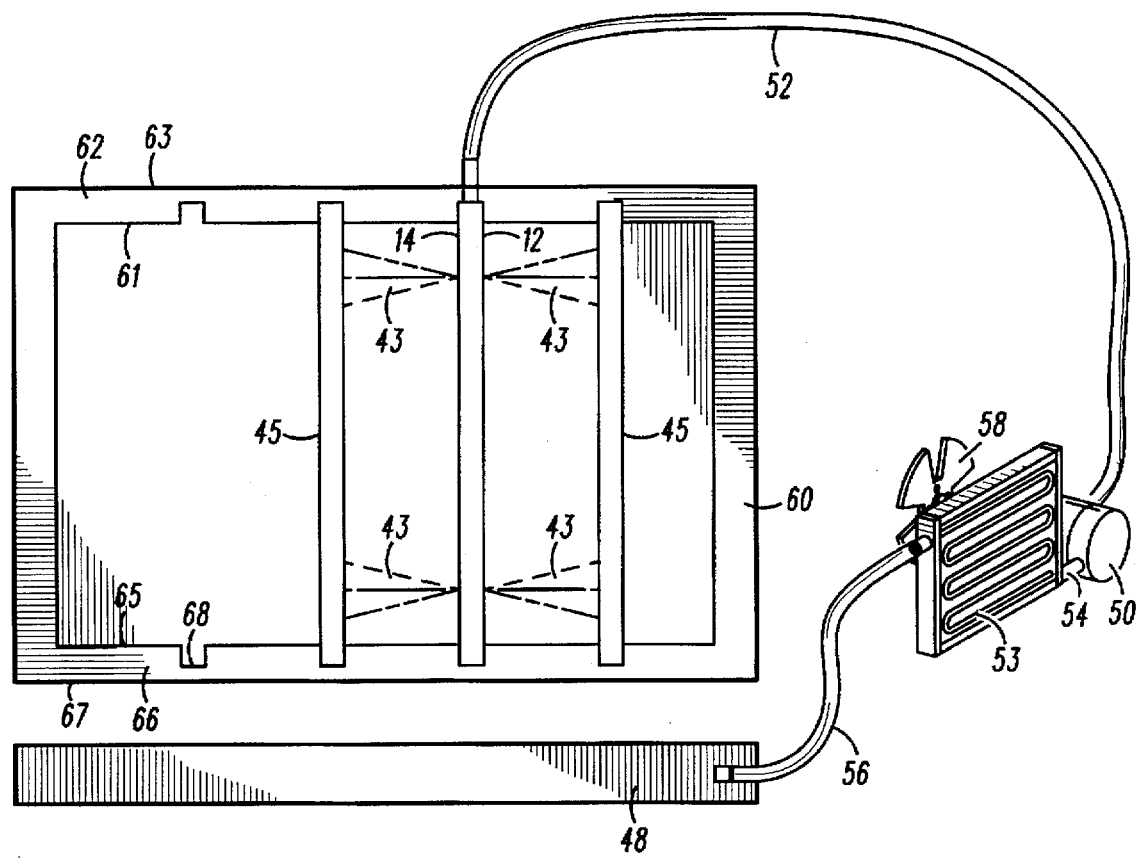
FIG. 5 illustrates a rack-type housing and a closed-loop fluid flow for the apparatus shown in FIGS. 1 through 4.

FIG. 5 illustrates a rack-type housing and a closed-loop fluid flow for the apparatus shown in FIGS. 1 through 4. Chassis 60, which defines a substantially rectangular chamber of any desired size, may be, for example, a Versa Module Europe (VME) rack-type housing. Chassis 60 may be constructed of any suitable material, for example plastic or a metal such as aluminum, and may be partitioned to create multiple chambers.

In one possible construction of chassis 60, a top wall 62 which has two sides, an interior side 61 and an exterior side 63, opposes a bottom wall 66 which also has an interior side 65 and an exterior side 67. A number of guides 68 are formed in interior side 61 of top wall 62 and in interior side 65 of bottom wall 66. Guides 68 on top wall 62 are in substantial alignment with guides 68 on bottom wall 66. Guides 68 optionally provide electrical interconnection for electronic modules.

In the preferred embodiment of the present invention, devices such as printed circuit boards 45 which support electronic modules are secured between pairs of guides 68.

Plate 10 may also be positioned by guides 68, preferably interposed between printed circuit boards 45, so that electronic modules on two printed circuit boards 45 are simultaneously cooled by atomized fluid 43 discharged from both layers 12, 14 of plate 10.

As shown in FIG. 5, atomized fluid 43 impinges upon two printed circuit boards 45 in a substantially similar manner. It is contemplated, however, that placement of nozzles 26 in fluid distributing conduits 28 located in interior surface 16 may be different from placement of nozzles 26 in fluid distributing conduits 28 formed in interior surface 20, to address specific cooling requirements of a particular circuit board 45 being spray-cooled. Thus, for example, first layer 12 of plate 10 may spray a top area of a first circuit board, while second layer 14 of plate 10 sprays a bottom area of a second circuit board.

Large spacing constraints between electronic modules which may be present in an air-cooled rack-type housing are rendered essentially non-existent when using the spray-cooling plate 10 described herein. Plate 10 may be placed virtually as close to a surface of an electronic module as the heights of components (not shown) attached to the module allow, resulting in compact module packaging because spacing within chassis 60 may be determined primarily by component height, rather than by air volume requirements. And unlike air cooling, which is most effective when heat is spread over a large area, for example, over a large heat sink, spray cooling encourages heat concentration, another factor contributing to reduced package volume and weight.

Referring again to FIG. 5, one example of a closed-loop fluid flow for chassis 60 is illustrated. A fluid supply tube 52 may be attached to fluid inlet port 23, to provide a flow of coolant fluid to conduits formed by fluid distributing conduits 28 within plate 10. Alternatively, a fluid supply reservoir (not shown) may be attached and sealed to a perimeter of exterior side 63 of top wall 62 to provide coolant fluid to plate 10. As a further alternative, a fluid backplane (not shown) may be coupled to chassis 60 to supply coolant to plate 10.

A fluid discharge reservoir 48 is attached and sealed to exterior side 67 of bottom wall 66. Fluid discharge reservoir 48 collects and drains fluid removed from chassis 60. Fluid preferably exits chassis 60 via openings (not shown) in bottom wall 66, aided by gravity. Of course, it may be desirable to further seal chassis 60, to reduce leakage of coolant fluid.

A fluid pump 50, which is coupled to fluid supply tube 52, provides a fluid flow. A condenser 53, connected to pump 50 by tube 54 and to fluid discharge reservoir 48 by tube 56, receives fluid from fluid discharge reservoir Condenser 53 rejects heat from the fluid, returning it to primarily a liquid phase. Fan 58 may be used to extend the cooling capacity of condenser 53. Cooled fluid is supplied from condenser 53 to fluid pump 50. Thus, a closed-loop flow of coolant fluid is formed. It will be appreciated that at any given point in the system the coolant fluid may be a vapor, a liquid or a vapor and liquid mixture.

It is contemplated that any conventional means for providing flow of a coolant may be used in conjunction with the described embodiments of the present invention. It is further contemplated that more than one chassis 60 may be connected to a single source of coolant, and that one or more sources of coolant may be connected to a single chassis for redundancy purposes, for example.

Sizes of fluid pump 50, condenser 53 and fan 58 should be selected based on heat removal and flow-rate requirements. For example, a typical closed loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

The closed-loop fluid flow system described herein has many advantages. For example, it is easily retrofitted to existing rack-type housings. And the system does not require managing a multitude of fluid lines or positioning individual spray nozzles. Consequently, despite the increase in heat density as circuits are further integrated and physical space on and between electronic modules on printed circuit boards is reduced, the fluid delivery and discharge system associated with the apparatus described herein should not increase in complexity.

The system has also been designed for convenient serviceability. For example, repairing the spray cooling system may be as simple as removing plate 10 from chassis 60, and typically would not involve disconnecting and re-positioning numerous fluid lines. Likewise, the system design provides for unobstructed access to individual spray-cooled electronic modules, further facilitating inspection and repair of the modules.

It will be understood that while the embodiments described show electronic modules being cooled during normal operation, the present invention is not limited to cooling during ordinary operation of the electronic modules, but may be adapted to, for example, testing and evaluation of the electronic modules or the electronic circuit devices included in the modules.

It will be further understood that wherever sealing and/or fastening may be required, numerous methods and materials may be used. For example, fasteners such as screws, compliant gaskets, ultrasonic welding, brazing, soldering or swaging may be utilized.

It will also be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for spray-cooling an electronic module, the apparatus comprising:
    a plate having a first layer and a second layer opposed to the first layer, the plate sized to be slidably mounted in a housing;
    a first fluid distributing conduit disposed in the second layer;
    a second fluid distributing conduit disposed in the second layer;
    a first nozzle housing having a first aperture, the first nozzle housing disposed in the first fluid distributing conduit; and
    a second nozzle housing having a second aperture, the second nozzle housing disposed in the second fluid distributing conduit.

2. The apparatus according to claim 1, further comprising: a fluid inlet port disposed in the plate.

3. The apparatus according to claim 2, wherein the fluid inlet port supplies a fluid to the first and second conduits.

4. The apparatus according to claim 3, wherein the plate is disposed between a first circuit board and a second circuit board.

5. The apparatus according to claim 4, wherein the plate is disposed in a Versa Module Europe (VME) cage.

6. The apparatus according to claim 4, wherein a first nozzle is disposed in the first nozzle housing.

7. The apparatus according to claim 6, wherein the first nozzle comprises stainless steel.

8. The apparatus according to claim 6, wherein the first nozzle atomizes the fluid and discharges the atomized fluid through the first aperture.

9. The apparatus according to claim 8, wherein the atomized fluid is discharged at a substantially perpendicular angle to the first layer and onto the first circuit board.

10. The apparatus according to claim 3, wherein the fluid comprises a dielectric fluid.

11. The apparatus according to claim 1, wherein the electronic module is selected from the group consisting essentially of: a passive component, a multi-chip module, and an electronic hybrid assembly.

12. The apparatus according to claim 1, wherein the plate comprises plastic.

13. The apparatus according to claim 1, wherein the plate comprises metal.

14. The apparatus according to claim 1, wherein cross-sections of the first fluid distributing conduit and the second fluid distributing conduit are selected from the group consisting essentially of: circular, conical and rectangular.

15. The apparatus according to claim 1, wherein the first layer is fastened to the second layer.

16. The apparatus according to claim 1, wherein the first layer and the second layer are integrally formed.

17. An apparatus for spray-cooling an electronic module, the apparatus comprising:

a plate having a first layer and a second layer, the first layer having a first interior surface and a first exterior surface and the second layer having a second interior surface and a second exterior surface, the plate sized to be slidably mounted in a housing;

a first fluid distributing conduit formed in the first. interior surface;

a second fluid distributing conduit formed in the second interior surface and substantially aligned with the first fluid distributing conduit to form a manifold;

a first nozzle disposed in the first fluid distributing conduit, the first nozzle having a first receptacle end and a first spray end, the first spray end having a first aperture, the first receptacle end in communication with first fluid distributing conduit and the first spray end communication with the first exterior surface; and a second nozzle disposed in the second fluid distributing conduit, the second nozzle having a receptacle end and a second spray end, the second spray end having a second aperture, the second receptacle end in communication with the second fluid distributing conduit the second spray end in communication with the second exterior surface, the first receptacle end receiving a fluid from first fluid distributing conduit, the first spray end atomizing the fluid and discharging the atomized fluid through the first aperture, and the second receptacle end receiving the fluid from the second fluid distributing conduit, the second spray end atomizing the fluid and discharging the atomized fluid through the second.

18. A method for spray-cooling an electronic module, the method comprising the steps of:

providing a plate having a first layer and a second layer, the first layer having a first fluid distributing conduit and the second layer having a second fluid distributing conduit, the plate sized to be slidably mounted in a housing;

receiving a fluid by a first nozzle disposed in the first fluid distributing conduit, the first nozzle having a first aperture;

receiving the fluid by a second nozzle disposed second fluid distributing conduit, the second nozzle having second aperture;

discharging the fluid via the first aperture; and discharging the fluid via the second aperture.

* * * * *

UNITED STATES PATENT AND TRADEMARK OFFICE
CERTIFICATE OF CORRECTION

PATENT NO. : 5,718,117
DATED : February 17, 1998
INVENTOR(S) : McDunn, et al.

It is certified that error appears in the above-indentified patent and that said Letters Patent is hereby corrected as shown below:

Column 7, line 20 reads "first. interior" should be --first interior--.

Column 7, line 33 reads "a receptacle" should be --a second receptacle--.

Column 8, line 4 reads "conduit the" should be --conduit and the--.

Column 8, line 7 reads "from first" should be --from the first--.

Column 8, line 13 reads "the second." should be --the second aperture--.

Signed and Sealed this

Twenty-first Day of July, 1998

*Attest:*

BRUCE LEHMAN

*Attesting Officer*  *Commissioner of Patents and Trademarks*